United States Patent
Chen et al.

(10) Patent No.: US 11,754,794 B2
(45) Date of Patent: Sep. 12, 2023

(54) SEMICONDUCTOR DEVICE INCLUDING OPTICAL THROUGH VIA AND METHOD OF MAKING

(71) Applicant: TAIWAN SEMICONDUCTOR MANUFACTURING COMPANY, LTD., Hsinchu (TW)

(72) Inventors: Yu-Hao Chen, Hsinchu (TW); Chung-Ming Weng, Hsinchu (TW); Tsung-Yuan Yu, Hsinchu (TW); Hui Yu Lee, Hsinchu (TW); Hung-Yi Kuo, Hsinchu (TW); Jui-Feng Kuan, Hsinchu (TW); Chien-Te Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/377,576

(22) Filed: Jul. 16, 2021

(65) Prior Publication Data
US 2022/0381999 A1 Dec. 1, 2022

Related U.S. Application Data

(60) Provisional application No. 63/192,701, filed on May 25, 2021.

(51) Int. Cl.
*G02B 6/42* (2006.01)
*G02B 6/122* (2006.01)
(Continued)

(52) U.S. Cl.
CPC .......... *G02B 6/4206* (2013.01); *G02B 6/122* (2013.01); *G02B 6/12002* (2013.01);
(Continued)

(58) Field of Classification Search
None
See application file for complete search history.

(56) References Cited

U.S. PATENT DOCUMENTS

| 6,236,786 | B1 * | 5/2001 | Aoki | ........................ G02B 6/43 385/14 |
| 6,865,310 | B2 * | 3/2005 | Yokouchi | ........... G02B 6/12007 385/9 |

(Continued)

FOREIGN PATENT DOCUMENTS

| CN | 102597827 | 7/2014 |
| CN | 102656495 | 3/2015 |

(Continued)

OTHER PUBLICATIONS

Office Action dated Dec. 15, 2021 for corresponding case No. DE 10 2021 118 637.4 (p. 1).

(Continued)

*Primary Examiner* — Omar R Rojas
(74) *Attorney, Agent, or Firm* — Hauptman Ham, LLP

(57) ABSTRACT

A semiconductor device includes a substrate. The semiconductor device further includes a waveguide on a first side of the substrate. The semiconductor device further includes a photodetector (PD) on a second side of the substrate, opposite the first side of the substrate. The semiconductor device further includes an optical through via (OTV) optically connecting the PD with the waveguide, wherein the OTV extends through the substrate from the first side of the substrate to the second side of the substrate.

20 Claims, 14 Drawing Sheets

(51) Int. Cl.
*G02B 6/12* (2006.01)
*G02B 6/43* (2006.01)
*G02B 6/136* (2006.01)

(52) U.S. Cl.
CPC ........... *G02B 6/136* (2013.01); *G02B 6/4214* (2013.01); *G02B 6/43* (2013.01)

(56) References Cited

U.S. PATENT DOCUMENTS

| | | | |
|---|---|---|---|
| 7,991,248 B2 | 8/2011 | Matsuoka et al. | |
| 8,340,483 B2* | 12/2012 | Lee ..................... | G02B 6/4204 385/33 |
| 9,746,608 B1 | 8/2017 | Rabiei | |
| 10,197,730 B1 | 2/2019 | Ngu et al. | |
| 2008/0080809 A1* | 4/2008 | Kushiyama ............. | G06F 1/105 385/14 |
| 2011/0091157 A1 | 4/2011 | Yao et al. | |
| 2012/0020614 A1 | 1/2012 | Han et al. | |
| 2015/0226987 A1 | 8/2015 | Park et al. | |

FOREIGN PATENT DOCUMENTS

| | | |
|---|---|---|
| CN | 103163600 | 3/2016 |
| JP | 2000298216 | 10/2000 |
| JP | 5399671 | 1/2014 |
| TW | 201227019 | 7/2012 |
| TW | 201229592 | 7/2012 |
| TW | I522668 | 2/2016 |

OTHER PUBLICATIONS

Office Action dated Apr. 11, 2022 for corresponding case No. TW 11120345690. (pp. 1-6).

* cited by examiner

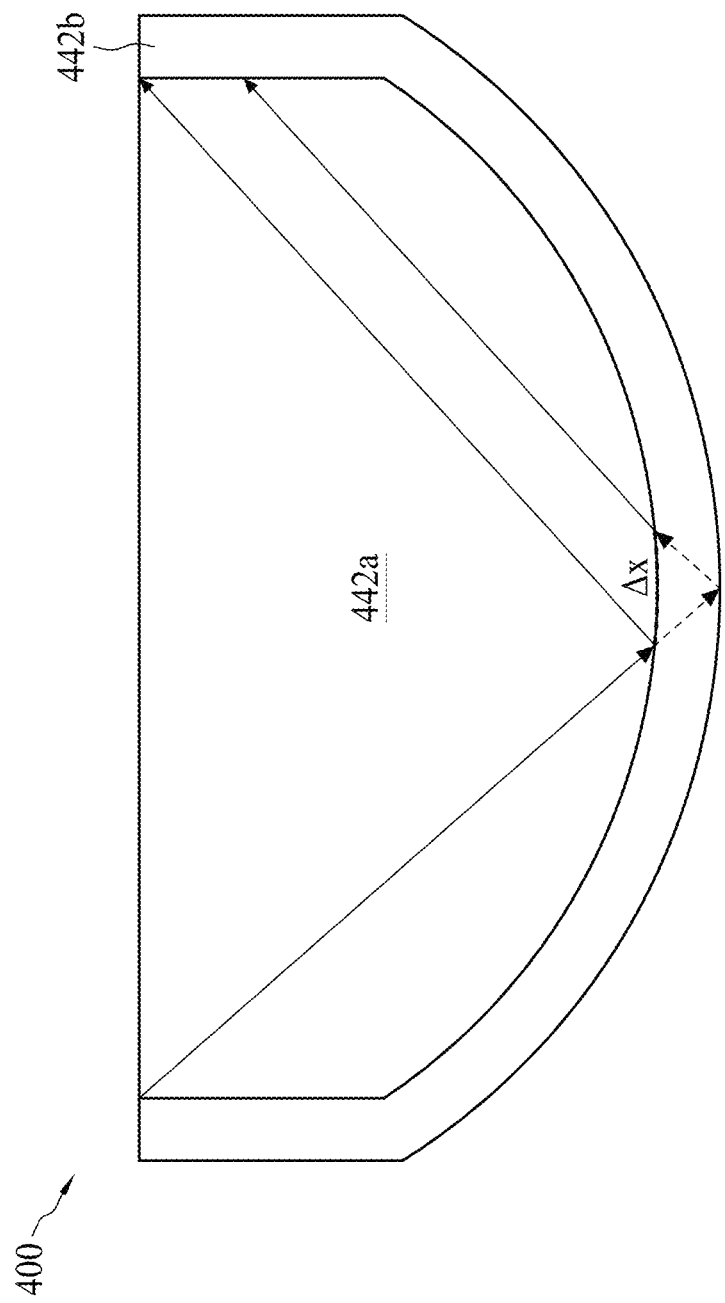

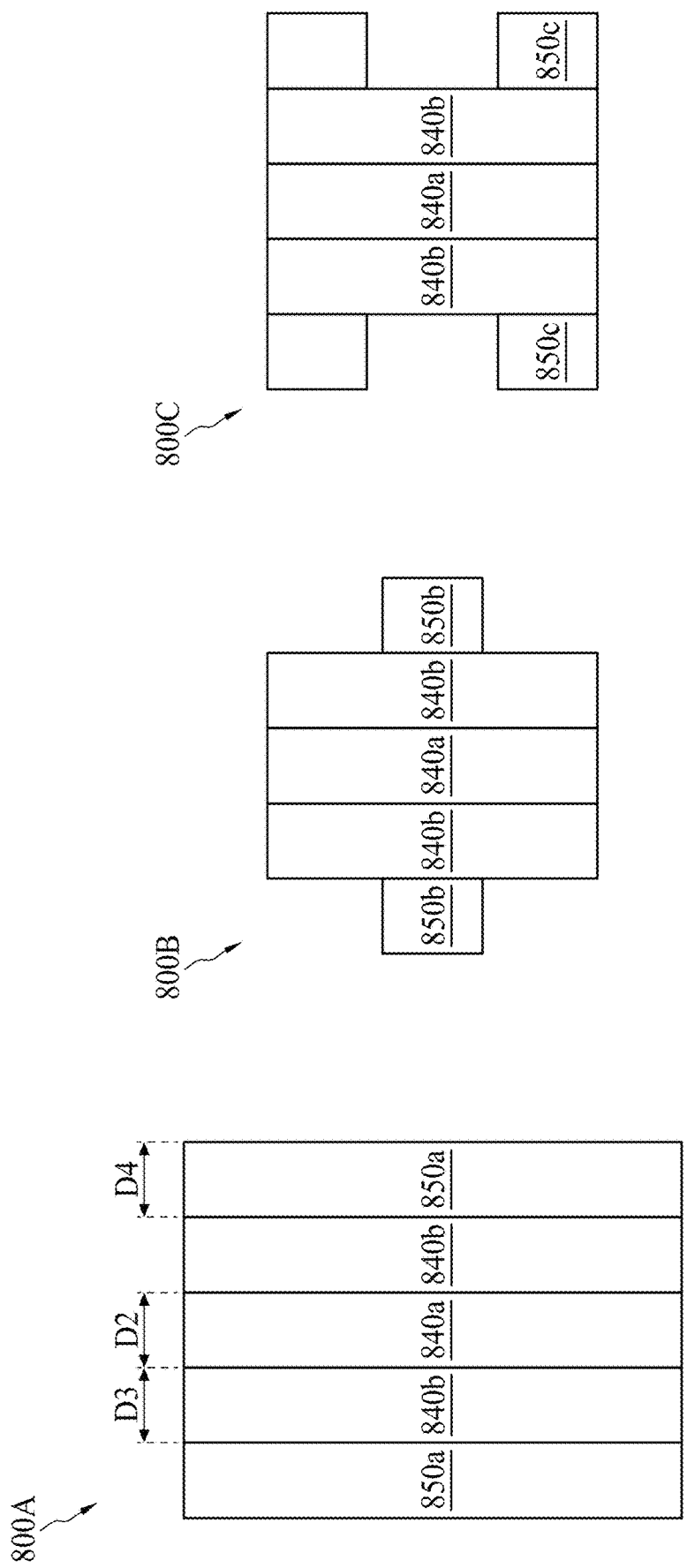

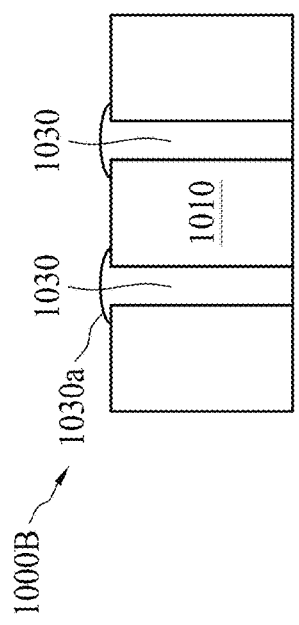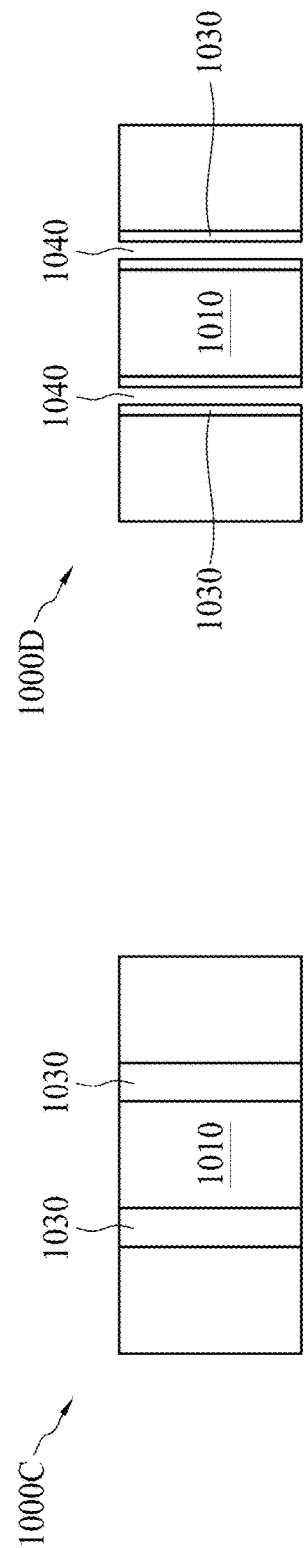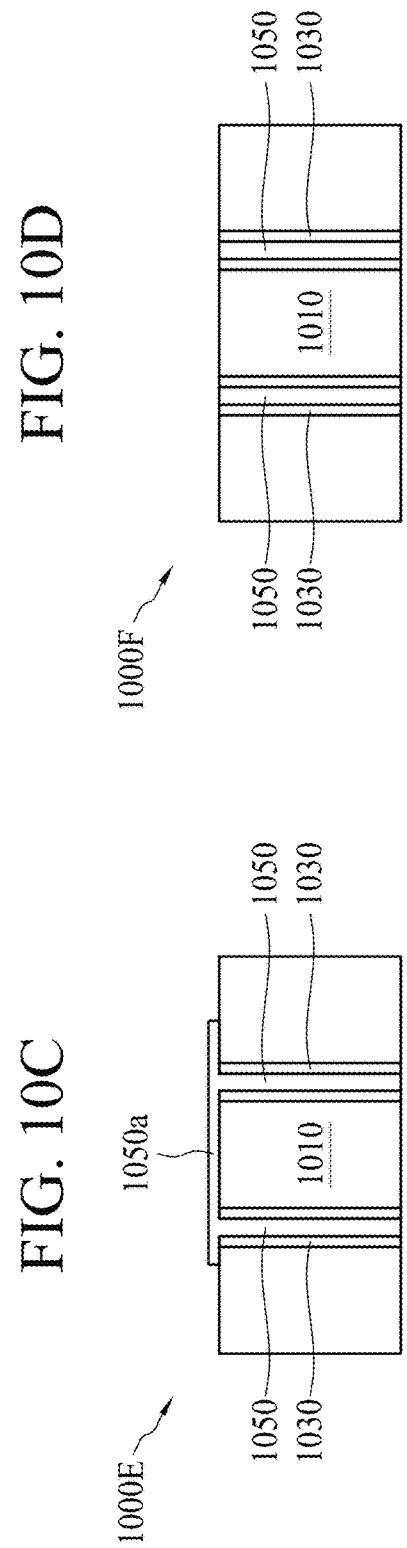

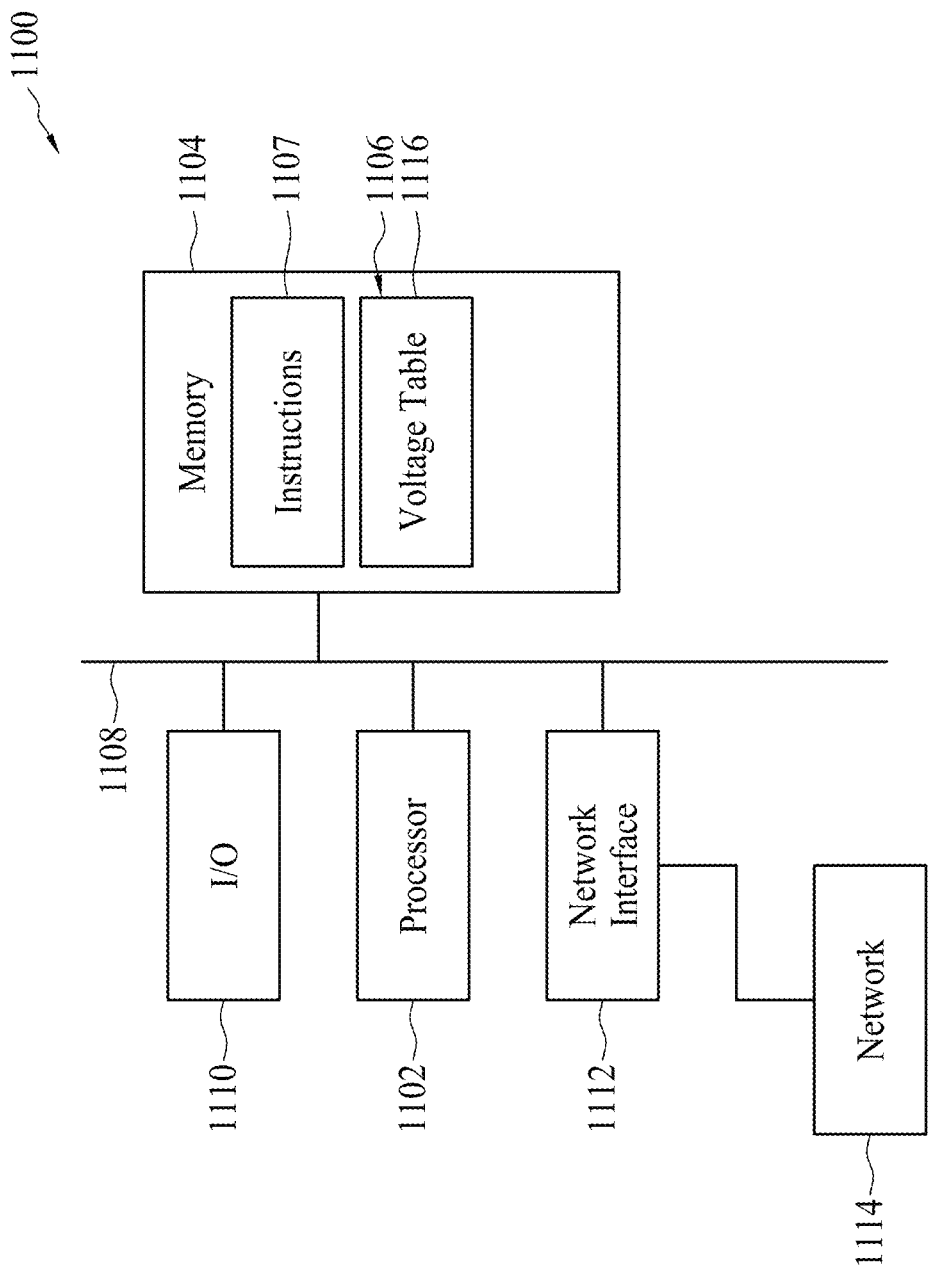

SEMICONDUCTOR DEVICE INCLUDING OPTICAL THROUGH VIA AND METHOD OF MAKING

PRIORITY CLAIM AND CROSS-REFERENCE

The current application claims priority to provisional application 63/192,701 filed May 25, 2021, the entire contents of which are incorporated herein by reference in their entirety.

BACKGROUND

Three dimensional integrated circuits (3DICs) are used to vertically stack components in a device. Components on opposite sides of a substrate or interposer are electrically connected using through substrate vias (TSVs). The TSV is a conductive element used to transfer electrical signals from one side of the substrate or interposer to the opposite side to implement the functionality of 3DIC.

Photonic devices utilize optical waveguides to transfer signals between components of a device. Electrical signals are converted into optical signals. The optical signals propagate along the optical waveguide and are then converted back into an electrical signal by a photodetector for use in another component of the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a cross-sectional view of a beam deflecting portion of a waveguide in accordance with some embodiments.

FIGS. 8A-8C are cross-sectional views of an optical through via in accordance with some embodiments.

FIGS. 10A-10F are cross-sectional views of an optical through via at various stages of manufacture in accordance with some embodiments.

FIG. 11 is a block diagram of a control system in accordance with some embodiments.

DETAILED DESCRIPTION

Figure 1:
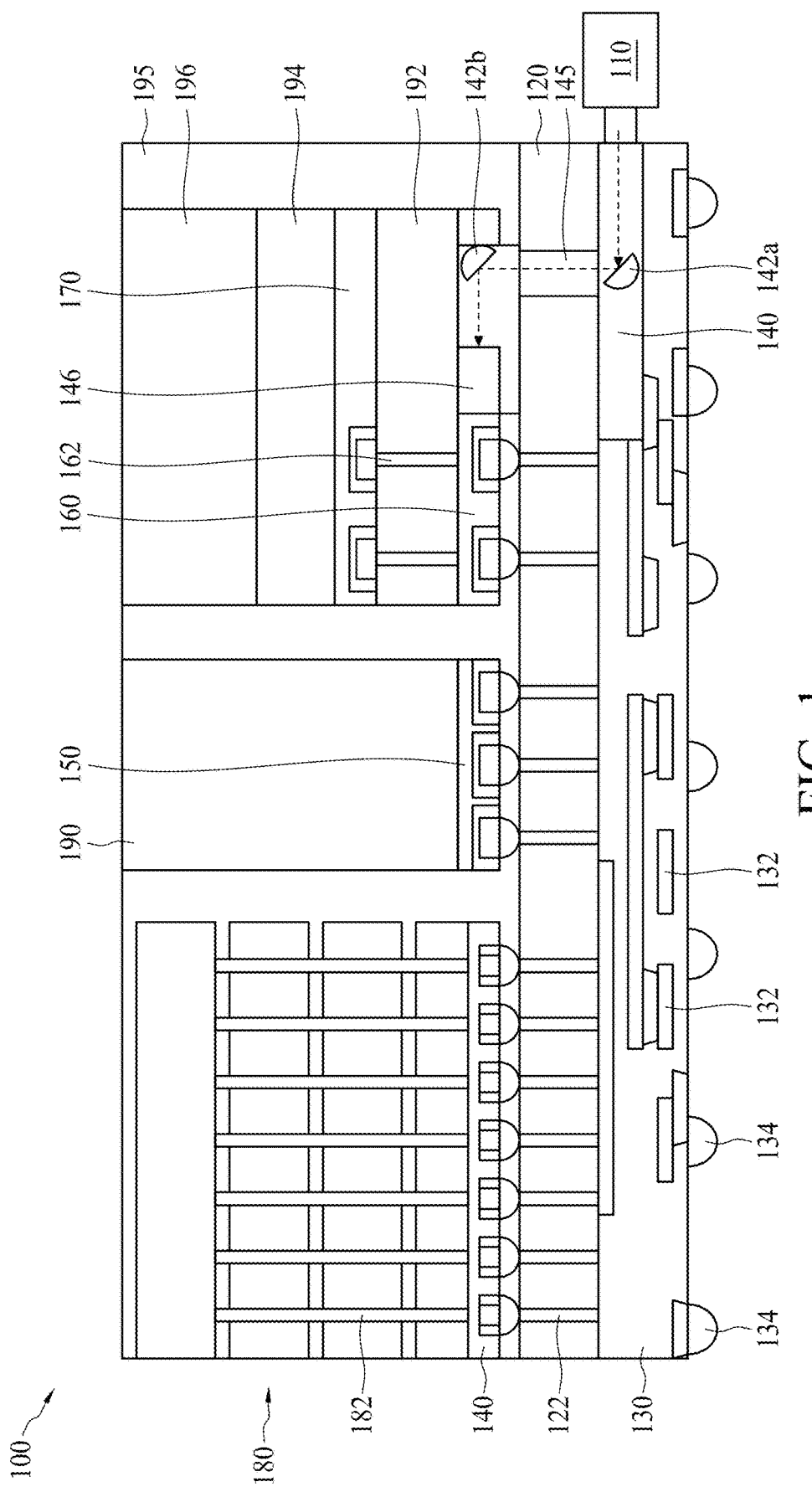
FIG. 1 is a cross-sectional view of a semiconductor device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Isolating photonic components onto a single side of a substrate or interposer limits the ability to use photonics in three-dimensional integrated circuit (3DIC) structures. The optical signal would be converted to an electrical signal, then transferred to the opposite side of the substrate or interposer using a conductive through substrate via (TSV) and then re-converted back into an optical signal to be transferred elsewhere within a semiconductor device. This conversion and re-conversion of the optical signal introduces more components into the 3DIC which increases production cost and device size. The conversion and re-conversion also increases a risk of incorrect signals being transferred between devices.

In order to help reduce production cost and device size, an optical through via (OTV) is used to transfer an optical signal from a first side of a substrate or interposer to a second, opposite, side of the substrate or interposer. Reflective elements on opposite sides of the substrate or interposer are usable to change a direction of propagation of the optical signal within a waveguide from a direction substantially parallel to a surface of the substrate or interposer to a direction substantially perpendicular to the surface of the substrate or interposer. In some embodiments, a first reflector is on a first side of the substrate or interposer; and a second reflector is on a second side of the substrate or interposer. In some embodiments, the reflectors are formed by curvatures of a cladding material surrounding a core of the waveguide.

In some embodiments, the reflectors are tunable to help control a direction of propagation of the optical signal. In some embodiments, conductive elements are positioned on or adjacent to the reflectors. An electrical current is then applied to the conductive elements and heat from the resistance in the conductive element is used to tune a reflective angle of the reflectors. In some embodiments, doped regions are formed in or adjacent to the cladding. An electrical charge is applied to the doped regions to tune a refractive index of the reflectors in order to tune to the reflective angle.

In some embodiments, the reflectors are elliptical, parabolic or planar. In some embodiments, the reflectors are concave. In some embodiments, the reflectors are convex. In some embodiments, the reflectors are controlled so that the optical signal is directed to targeted components of the semiconductor device.

FIG. 1 is a cross-sectional view of a semiconductor device 100 in accordance with some embodiments. The semiconductor device 100 includes a first waveguide 110 configured to transfer an optical signal to a second waveguide 140. The second waveguide 140 is on a first side of a substrate 120. A redistribution layer (RDL) 130 is also on the first side of the substrate 120. The RDL 130 includes a plurality of conductive elements 132 for transferring electrical signals through the RDL 130. A plurality of conductive bumps 134 are electrically connected to the conductive elements 132. The plurality of conductive bumps 134 are usable to bond the semiconductor device 100 to another component, e.g., through a reflow process. An OTV 145 in optical communication with the second waveguide 140 extends through the substrate 120. The semiconductor device 100 includes a single OTV 145. In some embodiments, multiple OTVs are included in the semiconductor device 100. A first beam deflector 142a is on the first side of the substrate and is usable to direct the optical signal in the second waveguide 140 into the OTV 145. A second beam deflector 142b is on a second side of the substrate 120, opposite the first side. The second beam deflector 142b is configured to direct the optical signal from the OTV 145 to a photodetector (PD) 146 in order to convert the optical signal into an electrical signal.

The electrical signal from the PD 146 is able to be transferred to any or all of several RDLs 140, 150, 160 and 170 on the second side of the substrate 120. In addition, the RDLs 140, 150, 160 and 170 are electrically connected to the RDL 130 on the first side of the substrate 120 by conductive through substrate vias (TSVs) 122. The conductive TSVs 122 permit transfer of electrical signals between the two sides of the substrate 120. In some embodiments, a second PD is on the first side of the substrate 120 to convert the optical signal to an electrical signal directly connected to the RDL 130.

The semiconductor device 100 further includes a memory stack 180 electrically connected to the RDL 140. The semiconductor device 100 further includes an application specific integrated circuit (ASIC) 190 electrically connected to the RDL 150. The semiconductor device 100 further includes a photonic integrated circuit (PIC) 192 electrically connected to the RDL 160. In some embodiments, the PIC 192 directly receives the optical signal from the second waveguide 140 through the OTV 145. The semiconductor device 100 further includes an electronic integrated circuit (EIC) 194 electrically connected to the RDL 170, which is electrically connected to the RDL 160. A heat spreader 196 is on a surface of the EIC 194 opposite the RDL 170. A fill material 195 surrounds the components of the semiconductor device 100 on the second side of the substrate 120. The fill material 195 provides structural support and electrical isolation for the components on the second side of the substrate 120.

The specific components of the semiconductor device 100 mentioned above are merely examples. One of ordinary skill in the art would recognize that different combinations of components and different arrangements of components are contemplated by this application. Further, one of ordinary skill in the art would recognize that functional circuitry, such as memory devices and integrated circuits, are formable on the first side of the substrate 120 as well.

The first waveguide 110 includes a core including an optically transparent material and is configured to permit propagation of an optical signal to the semiconductor device 100. In some embodiments, the core of the first waveguide 110 includes silicon. In some embodiments, the core of the first waveguide 110 includes polymer, glass, silicon nitride or another suitable material. A cladding material surrounds the core. The cladding material has a different refractive index from the core in order to help reduce an amount of signal loss as the optical signal propagates along the first waveguide 110. In some embodiments, the cladding has a lower refractive index than the core. In some embodiments, the cladding material is silicon oxide, polymer or another suitable material. In some embodiments, the first waveguide 110 has a circular cross-section. In some embodiments, the first waveguide 110 has a rectangular cross-section, a triangular cross-section or another suitable cross-sectional shape. In some embodiments, the first waveguide 110 is in direct contact with the second waveguide 140. In some embodiments, the first waveguide 110 is integral with the second waveguide 140. In some embodiments, the first waveguide 110 is spaced from the second waveguide 140.

The substrate 120 provides mechanical support for the structures on the first and second sides of the substrate. In some embodiments, the substrate 120 includes a semiconductor material. In some embodiments, the substrate 120 includes a dielectric material. In some embodiments, the substrate 120 functions as an interposer. In some embodiments, the substrate 120 functions as a wafer. In some embodiments, the substrate includes a semiconductor-on-insulator (SOI) substrate. In some embodiments, the substrate 120 includes silicon, polymer, silicon nitride, glass, silicon oxide, silicon carbide, diamond, metal, ceramic or another suitable material.

The RDL 130 routes electrical signals between the plurality of conductive bumps 134 and the conductive TSVs 122. In some embodiments that include a PD on the first side of the substrate 120, the RDL 130 routes electrical signals from the PD on the first side of the substrate 120 to the conductive TSVs 122 or the conductive bumps 134. In some embodiments, the RDL 130 is part of an integrated fan-out (InFO) structure for implementing fan out of the semiconductor device 100. The RDL 130 includes conductive elements 132, such as conductive lines and/or conductive vias, surrounded by a dielectric material. In some embodiments, the conductive elements 132 include a metal, such as copper, aluminum, tungsten, cobalt, gold, or another suitable metal. In some embodiments, the conductive elements 132 include another conductive material, such as a conductive polymer. In some embodiments, the conductive elements 132 include a barrier layer between the dielectric material and the conductive material of the conductive elements 132. The barrier layer helps to prevent diffusion of the conductive material into the surrounding dielectric material. In some embodiments, the barrier layer includes TaN or TiN. In some embodiments, the dielectric material includes silicon oxide, silicon nitride, silicon oxynitride or another suitable dielectric material. In some embodiments, the dielectric material includes a same material as the cladding of the first waveguide 110 or the second waveguide 140. In some embodiments, the dielectric material includes a different material from the cladding of both the first waveguide 110 and the second waveguide 140.

The plurality of conductive bumps 134 provide electrical connection between the RDL 130 and another component of an integrated circuit. In some embodiments, the plurality of conductive bumps 134 include solder bumps. In some embodiments, the plurality of conductive bumps 134 include conductive pillars. In some embodiments, the conductive pillars include copper, copper alloys, or another suitable material. In some embodiments, the plurality of conductive bumps 134 are bonded to the other component through a reflow process. In some embodiments, the plurality of conductive bumps 134 are bonded to the other component through eutectic bonding or another suitable bonding process.

The second waveguide 140 includes a core including an optically transparent material and is configured to permit propagation of an optical signal within the semiconductor device 100. In some embodiments, the core of the second waveguide 140 includes silicon. In some embodiments, the core of the second waveguide 140 includes polymer, glass, silicon nitride or another suitable material. In some embodiments, a core material of the second waveguide 140 is a same core material as the first waveguide 110. In some embodiments, the core material of the second waveguide 140 is different from the core material of the first waveguide 110. A cladding material surrounds the core. The cladding material has a different refractive index from the core in order to help reduce an amount of signal loss as the optical signal propagates along the second waveguide 140. In some embodiments, the cladding has a lower refractive index than the core. In some embodiments, the cladding material is silicon oxide, polymer or another suitable material. In some embodiments, a cladding material of the second waveguide 140 is a same cladding material as the first waveguide 110. In some embodiments, the cladding material of the second waveguide 140 is different from the cladding material of the first waveguide 110. In some embodiments, the second waveguide 140 has a circular cross-section. In some embodiments, the second waveguide 140 has a rectangular cross-section, a triangular cross-section or another suitable cross-sectional shape. In some embodiments, a cross-sectional shape of the second waveguide 140 is a same cross-sectional shape as the first waveguide 110. In some embodiments, the cross-sectional shape of the second waveguide 140 is different from the cross-sectional shape of the first waveguide 110.

The first beam deflector 142a is on the first side of the substrate 120 in the second waveguide 140. The second waveguide 140 extends beyond the first beam deflector 142a. In some embodiments, the first beam deflector 142a is at an end of the second waveguide 140 on the first side of the substrate 120. The first beam deflector 142a is configured to redirect the optical signal into the OTV 145. In some embodiments, an angle of deflection of the optical signal incident by the first beam deflector 142a is adjustable. The first beam deflector 142a is implemented by a reflection between the core material and the cladding material of the second waveguide 140. Additional details and options for the first beam deflector 142a are described below.

The second beam deflector 142b is on the second side of the substrate 120 in the second waveguide 140. The OTV 145 is between the first beam deflector 142a and the second beam deflector 142b. The second beam deflector 142b is at an end of the second waveguide 140 in the direction perpendicular to the second surface of the substrate 120 on the second side of the substrate 120. In some embodiments, the second waveguide 140 extends beyond the second beam deflector 142b in a direction perpendicular to the second surface of the substrate 120. The second beam deflector 142b is configured to redirect the optical signal from the OTV 145 toward the PD 146. In some embodiments, an angle of deflection of the optical signal incident by the second beam deflector 142b is adjustable. The second beam deflector 142b is implemented by a reflection between the core material and the cladding material of the second waveguide 140. Additional details and options for the second beam deflector 142b are described below. In some embodiments, a structure of the first beam deflector 142a is a same structure as the second beam deflector 142b. In some embodiments, the structure of the first beam deflector 142a is different from the structure of the second beam deflector 142b.

The PD 146 is usable to convert the optical signal from the second waveguide 140 to an electrical signal usable by electronic elements of the semiconductor device 100. In some embodiments, the PD 146 includes a photodiode. In some embodiments, the PD 146 includes a plurality of photodiodes configured to receive the optical signal at different locations. In some embodiments, the PD 146 includes isolation structures between adjacent photodiodes in order to reduce cross-talk between the adjacent photodiodes.

Each of the RDLs 140, 150, 160 and 170 routes electrical signals between corresponding electronic elements of the semiconductor device, such as ASIC 190, and the conductive TSVs 122 and/or the PD 146. In some embodiments, at least one of the RDLs 140, 150, 160 or 170 is part of an InFO structure for implementing fan out of the semiconductor device 100. Each of the RDLs 140, 150, 160 and 170 includes conductive elements (not labeled), such as conductive lines and/or conductive vias, surrounded by a dielectric material. In some embodiments, the conductive elements include a metal, such as copper, aluminum, tungsten, cobalt, gold, or another suitable metal. In some embodiments, the conductive elements include another conductive material, such as a conductive polymer. In some embodiments, each of the RDLs 140, 150, 160 and 170 includes a same material for the conductive elements. In some embodiments, at least one of the RDLs 140, 150, 160 and 170 includes a conductive element of a different material from another of the RDLs 140, 150, 160 and 170. In some embodiments, the conductive elements include a barrier layer between the dielectric material and the conductive material of the conductive elements. The barrier layer helps to prevent diffusion of the conductive material into the surrounding dielectric material. In some embodiments, the barrier layer includes TaN or TiN. In some embodiments, the dielectric material includes silicon oxide, silicon nitride, silicon oxynitride or another suitable dielectric material. In some embodiments, the dielectric material includes a same material as the cladding of the first waveguide 110 or the second waveguide 140. In some embodiments, the dielectric material includes a different material from the cladding of both the first waveguide 110 and the second waveguide 140. In some embodiments, each of the RDLs 140, 150, 160 and 170 includes a same material for the dielectric material. In some embodiments, at least one of the RDLs 140, 150, 160 and 170 includes a dielectric material of a different material from another of the RDLs 140, 150, 160 and 170.

The memory stack 180 includes a plurality of arrays of memory devices as part of a three-dimensional structure. Memory devices in the memory stack 180 are accessible based on electrical signals generated based on the optical signal received at PD 146 or another PD within the semiconductor device 100. Signals are transferred through the arrays of memory devices using conductive structures 182. The type of memory devices within the arrays of memory devices is not limited by this description. In some embodiments, the memory stack 180 further includes a driver for accessing memory devices within the memory stack 180. In some embodiments, memory devices within the memory stack 180 are accessed by the ASIC 190 or another component of the semiconductor device 100.

The ASIC 190 is configured to implement a designed functionality based on electrical signals generated based on the optical signal received at PD 146 or another PD within the semiconductor device 100. In some instances, the ASIC 190 is referred to as an integrated circuit device, a circuit, a device, a circuit device, a die, or in other terms known to those skilled in the art. The ASIC 190 is usable to process digital or analog signals generated by the PD 146 or another component of the semiconductor device 100. In some embodiments, the ASIC 190 includes millions of components such as active devices and passive devices. In some embodiments, the ASIC includes an inter-layer dielectric (ILD) layer for isolating conductive elements, active devices and passive devices from one another. In some embodiments, the ILD includes a material such as boron phosphorous silicate glass (BPSG), although any suitable dielectric is usable. In some embodiments, the ASIC 190 further includes an inter-metal dielectric (IMD) layer as part of an interconnect structure to connect various devices to each other.

The PIC 192 is usable to process the optical signal directly from the second waveguide 140. In some embodiments, the PIC 192 is usable to convert electrical signals from other components in the semiconductor device 100 into an optical signal to be transmitted into the second waveguide 140. In some embodiments, the PIC 192 is configured to process, receive, and/or transmit optical signals. The PIC 192 is thus also being referred to as an optical chip in some applications. In some embodiments, the PIC 192 includes one or more active and/or passive components configured to process, receive and/or transmit electrical signals converted to/from optical signals by a PD. In some embodiments, the PIC 192 further includes light detecting devices such as photo-sensors. In some embodiments, electrical signals from the RDL 160 pass through the PIC 192 to the RDL 170 for use by the EIC 194.

In some embodiments, the EIC 194 is a driver IC, and includes one or more active components and/or passive components. Examples of passive components include, but are not limited to, resistors, capacitors, and inductors. Examples of active components include, but are not limited to, diodes, field effect transistors (FETs), metal-oxide-semiconductor FETs (MOSFETs), complementary metal-oxide-semiconductor (CMOS) transistors, and bipolar transistors. In some embodiments, a laser die is bonded to the RDL 170 to electrically connect to the EIC 194 and optically connect with the PIC 192.

The heat spreader 196 is configured to dissipate heat generated during operation of the semiconductor device 100. The heat spreader 196 is in direct contact with the EIC 194. In some embodiments, the heat spreader 196 is thermally connected to the EIC 194 and/or other components of the semiconductor device 100 through thermally conductive elements. In this manner, heat generated by various components of the semiconductor device 100 is transferred to the heat spreader 196 in order for the heat to be dissipated to a surrounding environment. In some embodiments, the heat spreader 196 includes a plurality of fins. In some embodiments, the heat spreader 196 is fluid cooled.

The fill material 195 provides mechanical support and electrical insulation between dies on the second side of the substrate 120. In some embodiments, a fill material is also present on the first side of the substrate 120. In some instances, the fill material is called a molding compound. The fill material 195 extends over the top surface of the memory stack 180. In some embodiments, the fill material 195 has a top surface coplanar with the top surface of the memory stack 180. The ASIC 190 and the heat spreader 196 extend above the top surface of the fill material 195. In some embodiments, the top surface of the fill material 195 is coplanar with or above a top surface of the ASIC 190 or the heat spreader 196. In some embodiments, conductive pillars (not labeled) extend through the fill material 195 to electrically connect the TSVs 122 with the RDLs 140, 150 and 160.

Figure 2:
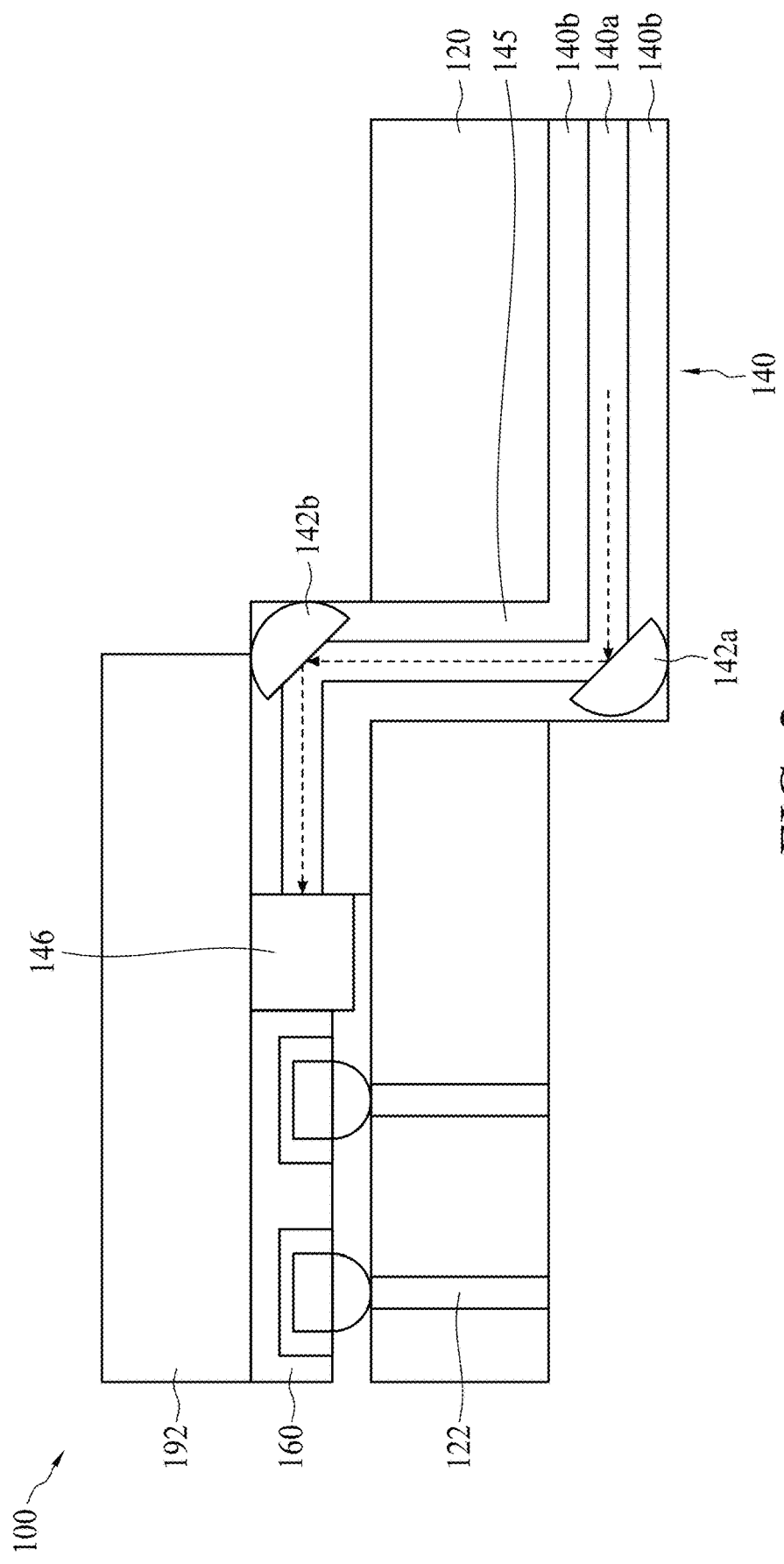
FIG. 2 is a cross-section view of a portion of a semiconductor device in accordance with some embodiments.

FIG. 2 is a cross-section view of a portion of the semiconductor device 100 in accordance with some embodiments. In comparison with FIG. 1, FIG. 2 provides additional details related to the second waveguide 140 as well as the first beam deflector 142a and the second beam deflector 142b. The fill material 195 (FIG. 1) is not included in FIG. 2 for the sake of clarity. The second waveguide 140 includes a core 140a and a cladding 140b surrounding the core 140a. The cladding 140b completely surrounds the core 140a. A refractive index of the cladding 140b is different from the refractive index of the core 140a in order to promote total internal reflection (TIR) to maintain the optical signal within the second waveguide 140. The first beam deflector 142a and the second beam deflector 142b are defined in the cladding 140b. Details of a structure of a beam deflector within the cladding are discussed in more detail below in FIG. 4. The core 140a is continuous from the first side of the substrate 120 in the OTV 145 and the second side of the substrate 120. The continuous core 140a helps to minimize backscattering and other dispersive effects of the optical signal propagating through the second waveguide 140. The cladding 140b is also continuous along the second waveguide 140 to minimize an amount of the optical signal lost through sidewalls of the second waveguide 140.

Figure 3A:
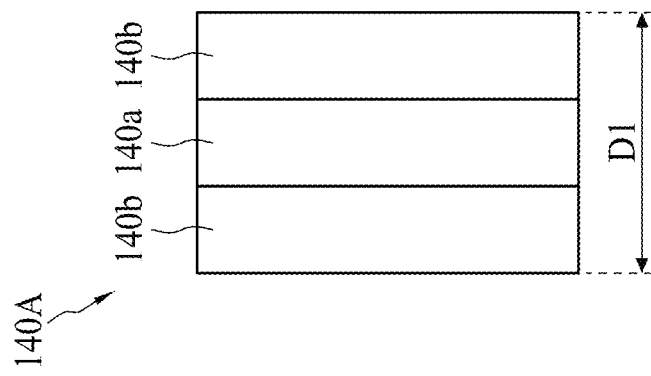
FIGS. 3A-3C are cross-sectional views of a waveguide taken along a first direction in accordance with some embodiments.
Figure 3B:
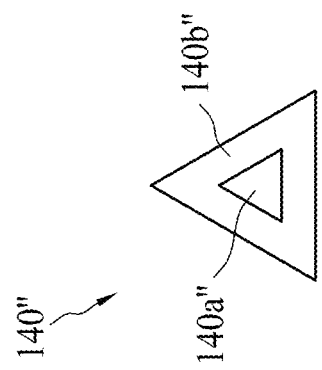
Figure 3C:
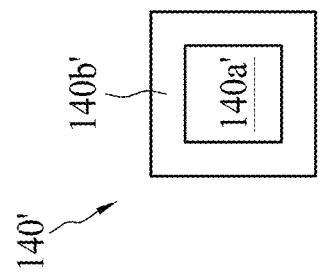

FIGS. 3A-3C are cross-sectional views of a waveguide in accordance with some embodiments. FIGS. 3A-3C include the second waveguide 140. However, one of ordinary skill in the art would recognize that the discussion regarding the cross-sectional shape is applicable to any waveguide in this description. In FIG. 3A, a circular cross-sectional shape of the second waveguide 140 is included. Both the core 140a and the cladding 140b have circular shapes with the core 140a being concentric with the cladding 140b. In FIG. 3B, a rectangular cross-sectional shape of the second waveguide 140' is included. Both the core 140a' and the cladding 140b' have rectangular shapes with the cladding 140b' completely surrounding the core 140a'. In FIG. 3C, a triangular cross-sectional shape of the second waveguide 140" is included.

Both the core 140*a*" and the cladding 140*b*" have triangular shapes with the cladding 140*b*" completely surrounding the core 140*a*'''.

Figure 3D:
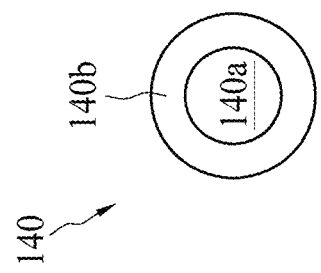
FIG. 3D is a cross-sectional view of a waveguide taken along a second direction in accordance with some embodiments.

FIG. 3D is a cross-sectional view of a waveguide in accordance with some embodiments. The cross-sectional view of the waveguide in FIG. 3D is a cross-section taken perpendicular to the cross-sectional views in FIGS. 3A-3C. A diameter D1 of the second waveguide 140 ranges from about 2 microns (μm) to about 100 μm. As the diameter D1 of the second waveguide 140 becomes too large, an overall size of the semiconductor device 100 is increased which impacts a size of a final product, in some instances. As the diameter D1 of the second waveguide 140 becomes too small, reliability concerns increase with respect to alignment of different components for coupling optical signals into and out of the second waveguide 140.

FIG. 4 is a cross-sectional view of a beam deflecting portion 400 of a waveguide in accordance with some embodiments. The beam deflecting portion 400 is usable as the first beam deflector 142*a* (FIG. 1) and/or the second beam deflector 142*b* (FIG. 1). The beam deflector portion 400 includes a core 442*a* and a cladding 442*b*. In some embodiments, the core 442*a* is similar to the core 140*a* (FIG. 2). In some embodiments, the cladding 442*b* is similar to the cladding 140*b* (FIG. 2).

As an optical signal propagates along a waveguide, e.g., the second waveguide 140 (FIG. 1), the optical signal is reflected by the cladding 442*b* due to the difference in refractive indices between the core 442*a* and the cladding 442*b*. The reflection at the interface between the core 442*a* and the cladding 442*b* is imperfect meaning that some of the optical signal is transmitted through the interface. An additional reflection occurs at an outer boundary of the cladding 442*b*. The additional reflection reflects a portion of the optical signal back into the core 442*a*. The portion of the optical signal reflected at the interface between the core 442*a* and the cladding 442*b* is offset from the portion of the optical signal reflected at the outer boundary of the cladding 442*b* by an offset distance Δx. This reflection due to refractive index differences and offset is called the Goos-Hänchen Effect. By controlling the refractive index differences between the core 442*a* and the cladding 442*b*, a direction of propagation of the optical signal is controllable. A refractive index of the cladding 442*b* is controllable based on temperature and/or conductivity of the cladding 442*b*.

FIGS. 5A-5D are cross-sectional views of a beam deflecting arrangement for a waveguide in accordance with some embodiments. The beam deflecting arrangements 500A-500D are usable for the first beam deflector 142*a* (FIG. 1) and/or for the second beam deflector 142*b* (FIG. 1). For the sake of simplicity, only a cladding and a control element are included in each of the beam deflecting arrangements 500A-500D. One of ordinary skill in the art would understand that additional components are included, such as a core and a controller for controlling the control element.

Figure 5D:
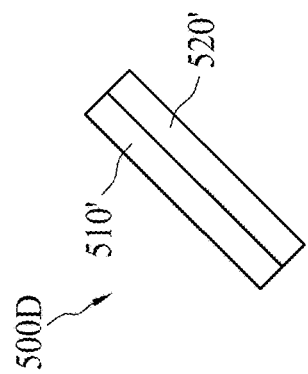
FIGS. 5A-5D are cross-sectional views of a beam deflecting arrangement for a waveguide in accordance with some embodiments.
Figure 5C:
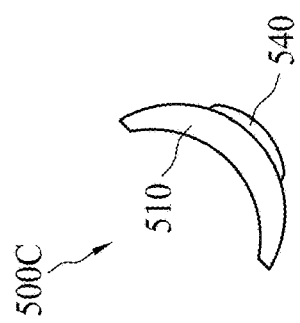
Figure 5B:
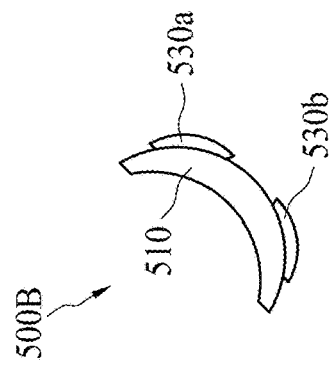
Figure 5A:
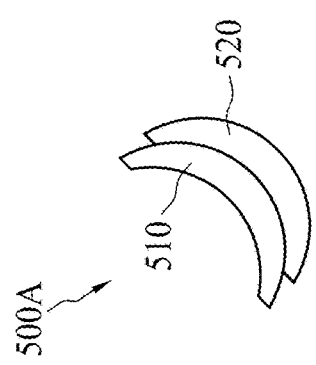

FIG. 5A is a cross-sectional view of a beam deflecting arrangement 500A for a waveguide in accordance with some embodiments. The beam deflecting arrangement 500A includes a cladding 510 and a control element 520. The control element 520 includes a conductive material configured to function as a resistor. As a current passes through the control element 520, as a result of an applied voltage, heat is generated due to resistance in the control element 520. The heat is transferred to the cladding 510, which alters a refractive index of the cladding 510. The change in refractive index of the cladding 510 changes an angle of reflection of the optical signal, as discussed above. In some embodiments, the control element 520 includes copper. In some embodiments, the control element 520 includes a copper alloy, aluminum, tungsten, cobalt or another suitable material. In some embodiments, the control element 520 includes a same material as other conductive elements within a semiconductor device, e.g., the semiconductor device 100 (FIG. 1). In some embodiments, the control element 520 includes a different material from at least one other conductive element within the semiconductor device.

An amount of voltage applied to the control element 520 is controlled by a controller (not shown). As the voltage increases, the heat generated by the control element 520 increases. The increased heat further adjusts the refractive index of the cladding 510. The beam deflecting arrangement 500A includes the control element 520 extending across an entirety of an outer boundary of the cladding 510 at a beam deflecting location. That is, the control element 520 is positioned at the beam deflecting location, but does not extend along an entirety of the waveguide.

FIG. 5B is a cross-sectional view of a beam deflecting arrangement 500B for a waveguide in accordance with some embodiments. The beam deflecting arrangement 500B includes a cladding 510 and control elements 530*a* and 530*b*. In comparison with the beam deflecting arrangement 500A (FIG. 5A), the beam deflecting arrangement 500B includes control elements 530*a* and 530*b* on peripheral regions of the cladding 510 with a space between the control elements 530*a* and 530*b* in a central region of the cladding 510. In some embodiments, the control elements 530*a* and 530*b* are connected to a same voltage supply element and are configured to receive a same voltage. In some embodiments, the control elements 530*a* and 530*b* are connected to different voltage supply elements, but are still configured to receive a same voltage. In some embodiments, the control elements 530*a* and 530*b* are connected to different voltage supply elements and are configured to be able to receive different voltages. In some embodiments, a material of the control elements 530*a* and 530*b* is similar to a material of the control element 520 (FIG. 5A). In some embodiments, a material of the control element 530*a* is a same material as the control element 530*b*. In some embodiments, the material of the control element 530*a* is different from the material of the control element 530*b*.

FIG. 5C is a cross-sectional view of a beam deflecting arrangement 500C for a waveguide in accordance with some embodiments. The beam deflecting arrangement 500C includes a cladding 510 and a control element 540. In comparison with the beam deflecting arrangement 500A (FIG. 5A), the beam deflecting arrangement 500C includes the control element 540 in a central region of the cladding 510 and the peripheral regions of the cladding 510 are exposed by the control element 540. In some embodiments, a material of the control element 540 is similar to a material of the control element 520 (FIG. 5A).

FIG. 5D is a cross-sectional view of a beam deflecting arrangement 500D for a waveguide in accordance with some embodiments. The beam deflecting arrangement 500D includes a cladding 510' and a control element 520'. In comparison with the beam deflecting arrangement 500A (FIG. 5A), the beam deflecting arrangement 500D includes a planar shape. In some embodiments, a material of the cladding 510' is similar to the material of the cladding 510 (FIG. 5A). In some embodiments, a material of the control element 520' is similar to the material of the control element 520 (FIG. 5A).

One of ordinary skill in the art would understand that a planar arrangement having the control element locations similar to the beam deflecting arrangement 500B (FIG. 5B) and/or the beam deflecting arrangement 500C (FIG. 5C) are also within the scope of this description.

Figures 6A, 6B:
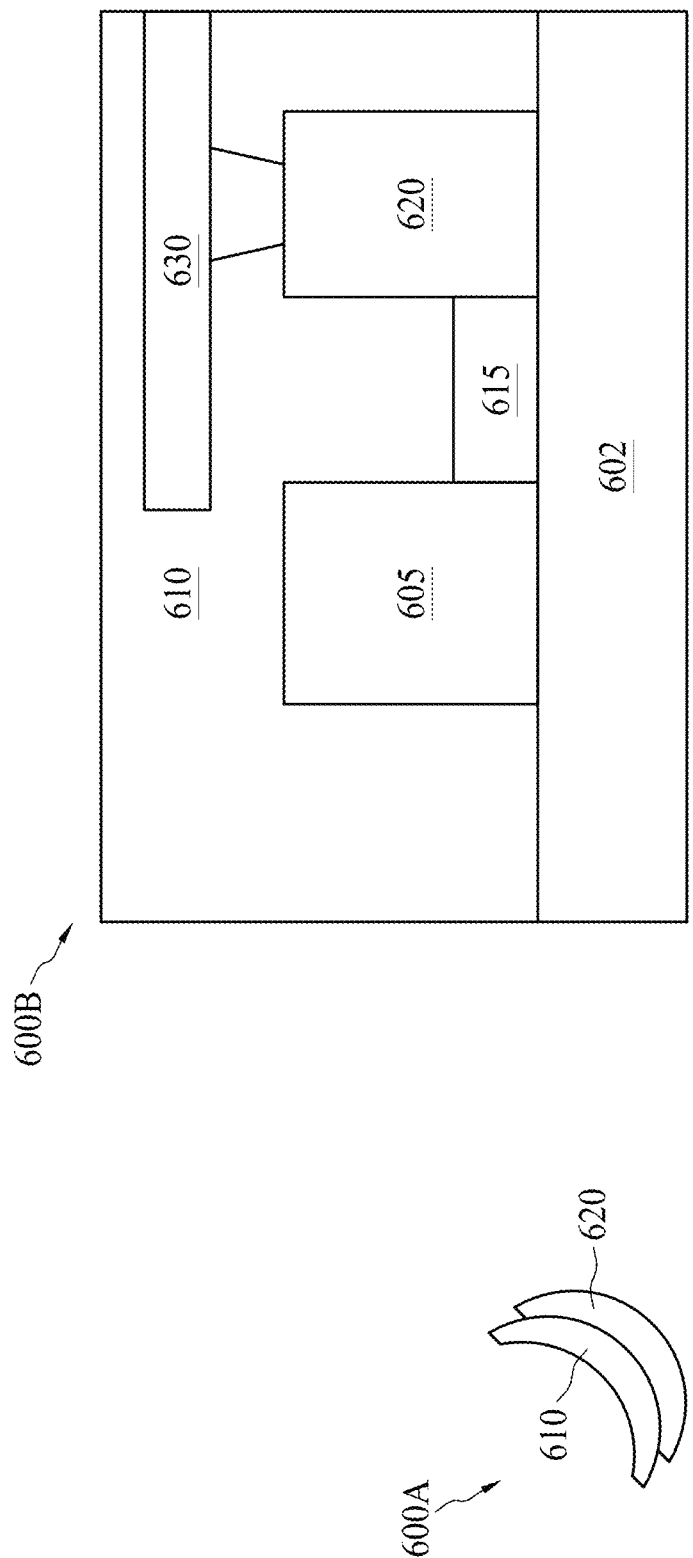
FIG. 6A is a cross-sectional view of a beam deflecting arrangement for a waveguide in accordance with some embodiments.
FIG. 6B is a cross-sectional view of a portion of a semiconductor device in accordance with some embodiments.

FIG. 6A is a cross-sectional view of a beam deflecting arrangement 600A for a waveguide in accordance with some embodiments. The beam deflecting arrangement 600A is usable for the first beam deflector 142a (FIG. 1) and/or for the second beam deflector 142b (FIG. 1). For the sake of simplicity, only a cladding and a control element are included in the beam deflecting arrangement 600A. One of ordinary skill in the art would understand that additional components are included, such as a core and a controller for controlling the control element.

The beam deflecting arrangement 600A includes a cladding 610 and a control element 620. In comparison with the beam deflecting arrangement 500A (FIG. 5A), the beam deflecting arrangement 600A includes a control element 620 including a heavily doped region. In some embodiments, the cladding 610 is similar to the cladding 510 (FIG. 5A). As a voltage is applied to the control element 620, dopants from the control element 620 are driving into the cladding 610 to change the refractive index of the cladding 610 and control the angle of reflection of the optical signal incident on the cladding 610. In some embodiments, the dopants are p-type dopants. In some embodiments, the dopants are n-type dopants. In some embodiments, a concentration of dopants in the control element 620 ranges from about $1\times10^{16}$ cm$^{-3}$ to about $1\times10^{20}$ cm$^{-3}$. If the dopant concentration is too low, then insufficient dopants are available to drive into the cladding 610 to effectively steer the reflection direction of the optical signal, in some instances. If the dopant concentration is too high, then a risk of current leakage increases, in some instances. In some embodiments, a concentration of dopants within the control element 620 is substantially uniform. In some embodiments, the control element 620 has a gradient concentration of dopants. For example, in some embodiments, a concentration of dopants at a first peripheral end of the control element 620 is about 200% to about 10000% greater than a dopant concentration at a second peripheral end of the control element 620 opposite the first peripheral end. In some embodiments, the concentration of dopants at the first peripheral end of the control element 620 is greater than the dopant concentration at the second peripheral end of the control element 620 by a value ranging from about 200 dopants/cm$^3$ to about 1,000 dopants/cm$^3$. One of ordinary skill in the art would recognize that a gradient of 0% means uniform concentration. If the concentration gradient is too high, then conductivity in the low concentration region may be insufficient to steer the reflection direction of the optical signal. In some embodiments, a single voltage is applied to the control element 620 by a controller (not shown) and driving of dopants into the cladding 610 is uniform. In some embodiments, multiple voltages are applied at different locations of the control element 620 to drive different amounts of dopants into the cladding 610 at different locations to further control steering of the optical signal.

One of ordinary skill in the art would understand that the doped control element arrangement having the control element locations similar to the beam deflecting arrangement 500B (FIG. 5B) and/or the beam deflecting arrangement 500C (FIG. 5C) are also within the scope of this description.

FIG. 6B is a cross-sectional view of a portion of a semiconductor device 600B in accordance with some embodiments. The semiconductor device 600B includes the cladding 610 and the control element 620 as discussed in the beam deflector arrangement 600A (FIG. 6A). The semiconductor device 600B further includes a substrate 602. In some embodiments, the substrate 602 is similar to the substrate 120 (FIG. 1). The semiconductor device 600B further includes a core 605. In some embodiments, the core 605 is similar to the core 140a (FIG. 2). The semiconductor device 600B further includes a driven doped region 615 within the cladding 610. The driven doped region 615 is a portion of the cladding where dopants from the control element 620 have been driving into the cladding 610 by a voltage applied from voltage supply element 630. The voltage supply element 630 is a conductive element for carrying a voltage to the control element 620. In some embodiments, the voltage supply element 630 is part of an interconnect structure. In some embodiments, a controller (not shown) is usable to control an amount of voltage applied to the control element 620 through the voltage supply element 630.

Figure 7A:
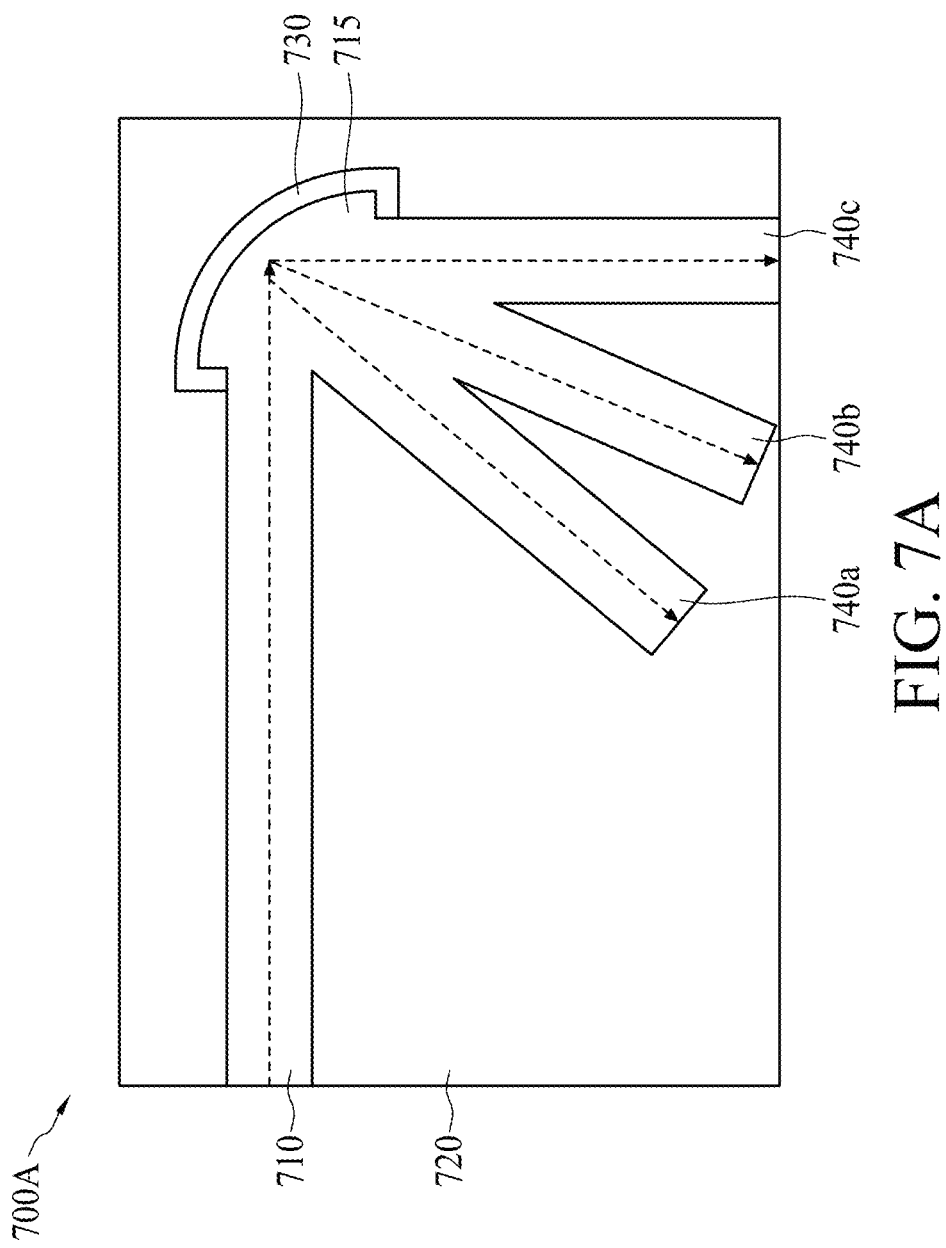
FIGS. 7A and 7B are cross-sectional views of a waveguide including a beam deflecting arrangement in accordance with some embodiments.
Figure 7B:
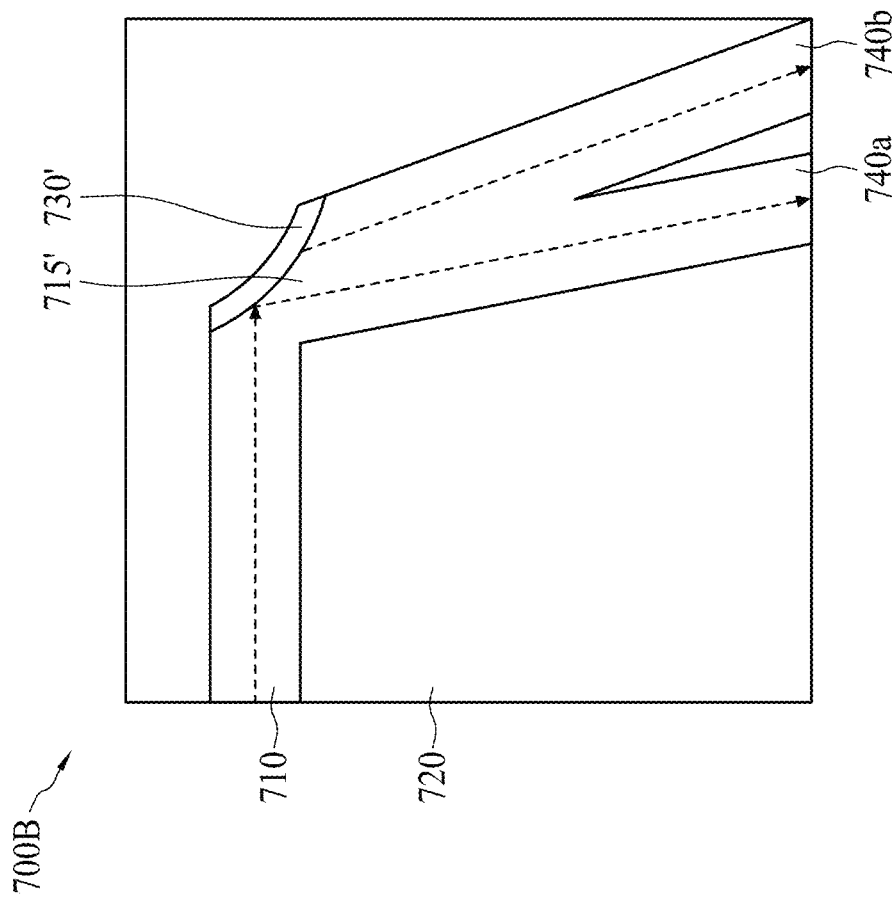

FIGS. 7A and 7B are cross-sectional views of a waveguide including a beam deflecting arrangement in accordance with some embodiments. The waveguides 700A and 700B are usable as second waveguide 140 (FIG. 1). The waveguides 700A and 700B are capable of functioning as either a multiplexer (MUX) or a de-multiplexer (DMUX) depending on a direction of propagation of the optical signal.

FIG. 7A is a cross-sectional view of a waveguide 700A including a first core portion 710 and a plurality of second core portions 740a-740c. The waveguide 700A further includes a deflection zone core portion 715. A cladding 720 surrounds the first core portion 710, the deflection zone core portion 715 and each of the plurality of second core portions 740a-740c. A control element 730 is configured to control a direction of reflection of the optical signal by the cladding 720 between the control element 730 and the deflection zone core portion 715. The deflection zone core portion 715 forms a concave reflection shape. In some embodiments, each of the first core portion 710, the deflection zone core portion 715 and each of the plurality of second core portions 740a-740c are similar to the core 140a (FIG. 2). In some embodiments, the cladding 720 is similar to the cladding 140b (FIG. 2). In some embodiments, the control element 730 is similar to the control element 520 (FIG. 5A). In some embodiments, the control element 730 is similar to the control element 620 (FIG. 6A). One of ordinary skill in the art would understand that the control element arrangement having the control element locations similar to the beam deflecting arrangement 500B (FIG. 5B) and/or the beam deflecting arrangement 500C (FIG. 5C) are also within the scope of this description.

By controlling the voltage applied to the control element 730, a controller (not shown) is able to control the angle of reflection of the optical signal to selective propagate the optical signal along a desired path. In situations where the optical signal propagates from the first core portion 710 to one of the second core portions 740a-740c, the waveguide 700A functions as a DMUX. In the DMUX functionality, the optical signal is received at the deflection zone core portion 715 from the first core portion 710. By controlling the voltage applied to the control element 730, the cladding 720 between the control element 730 and the deflection zone core portion 715 selectively deflects the optical signal along one of the plurality of second core portions 740a-740c.

In situations where the optical signal propagates from the plurality of second core portions 740a-740c to the first core portion, the waveguide 700A functions as a MUX. In the MUX functionality, the optical signal is received at the deflection zone core portion 715 from one of the plurality of second core portions 740a-740c. By controlling the voltage applied to the control element 730, the cladding between the control element 730 and the deflection zone core portion 715 deflects the optical signal along the first core portion 710. One of ordinary skill in the art would recognize that if the reflection angle does not satisfy a cone of acceptance of the first core portion 710, then a risk of loss of the optical signal or increases in backscattering increases. Controlling the voltage applied to the control element 730 and therefore the heat applied to the cladding 720 helps maximize an amount of the optical signal directed along the first core portion 710.

FIG. 7B is a cross-sectional view of a waveguide 700B including a first core portion 710 and a plurality of second core portions 740a-740b. In comparison with the waveguide 700A (FIG. 7A), the waveguide 700B includes a convex reflection surface at cladding 720 between the deflection zone core portion 715' and the control element 730'. In some embodiments, the control element 730' is similar to the control element 520 (FIG. 5A). In some embodiments, the control element 730' is similar to the control element 620 (FIG. 6A). One of ordinary skill in the art would understand that the control element arrangement having the control element locations similar to the beam deflecting arrangement 500B (FIG. 5B) and/or the beam deflecting arrangement 500C (FIG. 5C) are also within the scope of this description. The waveguide 700B is capable of functioning as a DMUX and a MUX in a similar fashion as that described above with respect to waveguide 700A (FIG. 7A).

Figure 7C:
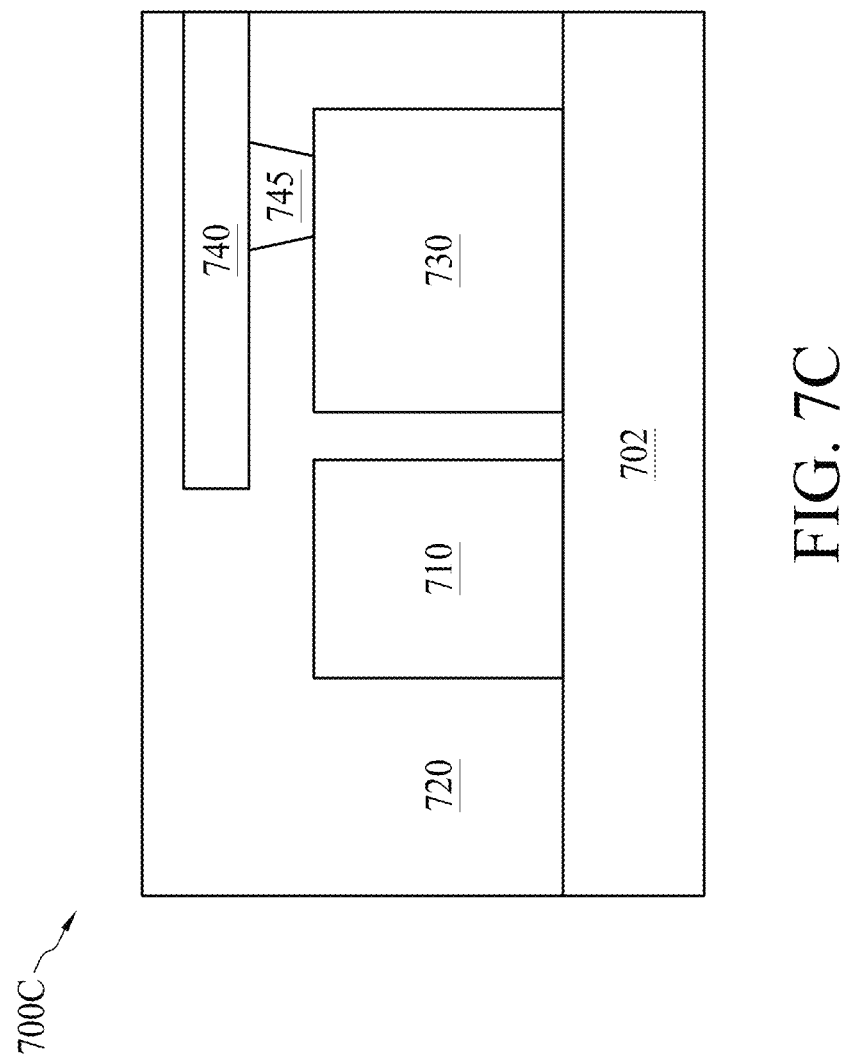
FIG. 7C is a cross-sectional view of a portion of a semiconductor device in accordance with some embodiments.

FIG. 7C is a cross-sectional view of a portion of a semiconductor device 700C in accordance with some embodiments. The semiconductor device 700C includes a core 710 over a substrate 702. A cladding 720 surrounds the core 710. A control element 730 is configured to receive a voltage from a controller (not shown) through a conductive line 740 and a conductive via 745. The cladding 720 is between the core 710 and the control element 730. The control element 730 is configured to generate heat for adjusting a temperature of the cladding 720 between the core 710 and the control element 730 in order to adjust an angle of reflection for an optical signal incident on the cladding 720 between the core 710 and the control element 730. In some embodiments, the substrate 702 is similar to the substrate 120 (FIG. 1). In some embodiments, the core 710 is similar to the core 140a (FIG. 2). In some embodiments, the cladding 720 is similar to the cladding 140b (FIG. 2). In some embodiments, the conductive line 740 and the conductive via 745 are similar to voltage supply element 630 (FIG. 6B).

Figure 7E:
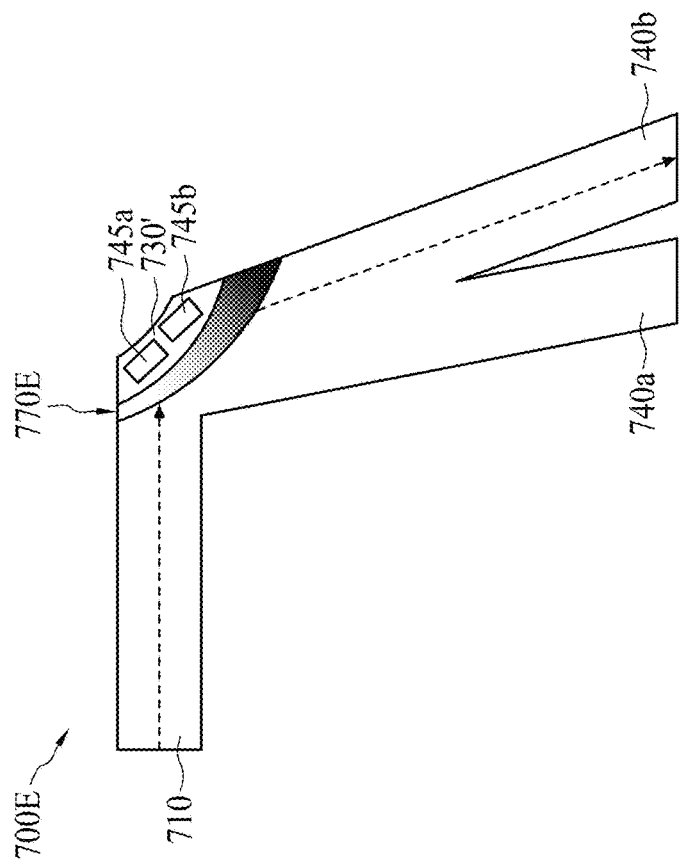
FIGS. 7D and 7E are cross-sectional views of a waveguide including a beam deflecting arrangement during operation in accordance with some embodiments.
Figure 7D:
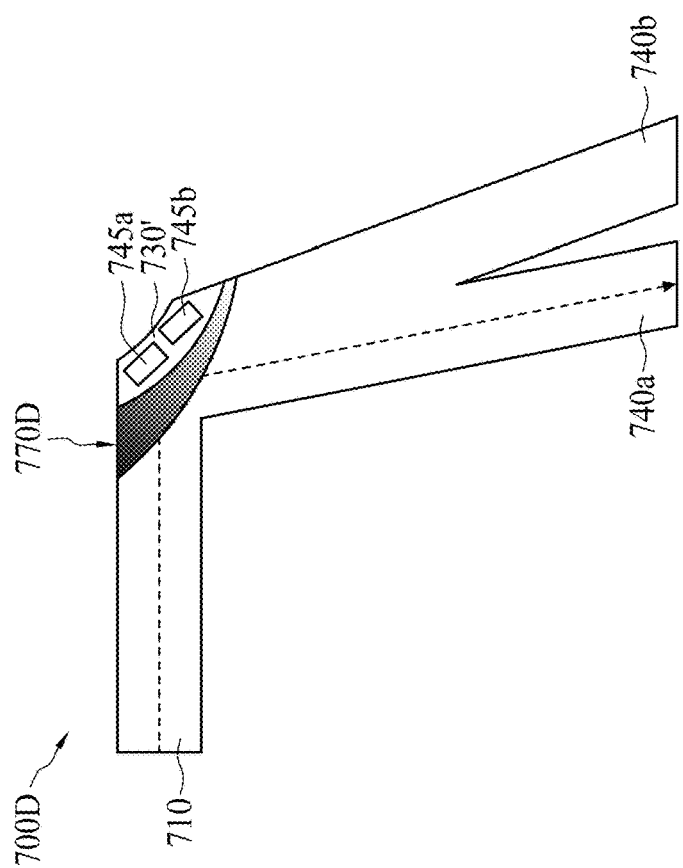

FIGS. 7D and 7E are cross-sectional views of a waveguide including a beam deflecting arrangement during operation in accordance with some embodiments. In comparison with other beam deflecting arrangements discussed above, the beam deflecting arrangements in FIGS. 7D and 7E clearly include multiple conductive vias 745a and 745b for providing a voltage to different locations of the control element 730'. The multiple conductive via arrangement is usable with other beam deflecting arrangements discussed above, including beam deflecting arrangements including doped regions and beam deflecting arrangement including a concave control element.

FIG. 7D is a cross-sectional view of a waveguide 700D including a beam deflecting arrangement during operation in accordance with some embodiments. The waveguide 700D is similar to the waveguide 700B. In comparison with the waveguide 700B, the waveguide 700D is shown as including a first conductive via 745a and a second conductive via 745b. While two conductive vias are included in the waveguide 700D, one of ordinary skill in the art would understand that other numbers of conductive vias are also contemplated by this disclosure. The waveguide 700D includes a higher voltage applied to the control element 730' at the first conductive via 745a. The higher voltage supplied by the first conductive via 745a produces a temperature gradient 770D. The temperature gradient 770D is not a physical element, but represents the temperature of the cladding between the core 710 and the control element 730'. The temperature of the cladding proximate the first conductive via 745a is higher than the temperature of the cladding proximate the second conductive via 745b. As a result, an angle of reflecting of the control element 730' is increased proximate the first conductive via 745a and the optical signal is steered along the second core portion 740a.

FIG. 7E is a cross-sectional view of a waveguide 700E including a beam deflecting arrangement during operation in accordance with some embodiments. In comparison with the waveguide 700D, the waveguide 700E includes a higher voltage supplied by the second conductive via 745b. As a result, a temperature gradient 770E of the cladding indicates a higher temperature proximate the second conductive via 745b than proximate the first conductive via 745a. The reflection angle for the optical signal is adjusted in order to steer the optical signal along the second core portion 740b.

By adjusting voltages applied to the first conductive via 745a and the second conductive via 745b, different optical signals are able to be steered along different second core portions 740a and 740b in order to direct the optical signal to the desired location for conversion to electrical signals usable by electronic components of a device. The above description of the waveguides 700D and 700E is a DMUX functionality. One of ordinary skill in the art would understand that changing the propagation direction of the optical signal would permit the waveguides 700D and 700E to have a MUX functionality.

FIG. 8A is a cross-sectional view of an OTV 800A in accordance with some embodiments. The OTV 800A is usable at the OTV 145 (FIG. 1). The OTV 800A includes a core 840a surrounded by a cladding 840b. The cladding 840b is surrounded by a control element 850a. The control element 850a has a similar functionality as other control elements described above, for example, the control element 520 (FIG. 5A) or the control element 620 (FIG. 6A). By including the control element 850a, propagation of the optical signal through the OTV 800A is controllable in order to assist with directing the optical signal to a specified component upon exiting the OTV 800A. In some embodiments, the core 840a is similar to the core 140a (FIG. 2). In some embodiments, the cladding 840b is similar to the cladding 140b (FIG. 2).

In some embodiments, a diameter D2 of the core 840a ranges from about 2 μm to about 20 μm. If a diameter of the core 840a is too small, then an angle of acceptance for the core 840a increases a risk of a loss of a portion of the optical signal when the optical signal is being directed into the OTV 800A, in some instances. If the diameter of the core 840a is too large, then an overall size of a device is increased without a significant improvement in performance, in some instances. In some embodiments, a diameter D3 of the cladding 840b ranges from about 5 μm to about 50 μm. If a diameter of the cladding 840b is too small, then a risk of loss of the optical signal through the outer wall of the cladding 840b increases, in some embodiments. If the diameter of the cladding 840b is too large, then the offset distance between the optical signal reflected at the core 840a and cladding 840b interface and the optical signal reflected at the outer wall of the cladding 840b becomes so large that signal coherency is significantly reduced, in some instances. In some embodiments, a diameter D4 of the control element 850a ranges from about 2 μm to about 20 μm. If the diameter of the control element 850a is too small, then a resistance of the control element 850a significantly increases and a risk of damage to the cladding 840b increases due to excessive heat, in some instances. If the diameter of the control element 850a is too large, then an overall size of a device is increased without significant improvement in performance, in some instances.

FIG. 8B is a cross-sectional view of an OTV 800B in accordance with some embodiments. The OTV 800B is usable at the OTV 145 (FIG. 1). In comparison with OTV 800A (FIG. 8A), the OTV 800B includes the control element 850b at a central portion of the OTV 800B and the cladding 840b at peripheral regions of the OTV 800B are exposed. The size and shape of the control element 850b are the same on both sides of the cladding 840b in OTV 800B. In some embodiments, the size or the shape of the control element 850b is different on different portions of the cladding 840b.

FIG. 8C is a cross-sectional view of an OTV 800C in accordance with some embodiments. The OTV 800C is usable at the OTV 145 (FIG. 1). In comparison with OTV 800A (FIG. 8A), the OTV 800C includes the control element 850c at peripheral portions of the OTV 800C and the cladding 840b at a central region of the OTV 800C is exposed. The size and shape of the control element 850c are the same on both sides of the cladding 840b in OTV 800C. In some embodiments, the size or the shape of the control element 850c is different on different portions of the cladding 840b.

Figure 9:
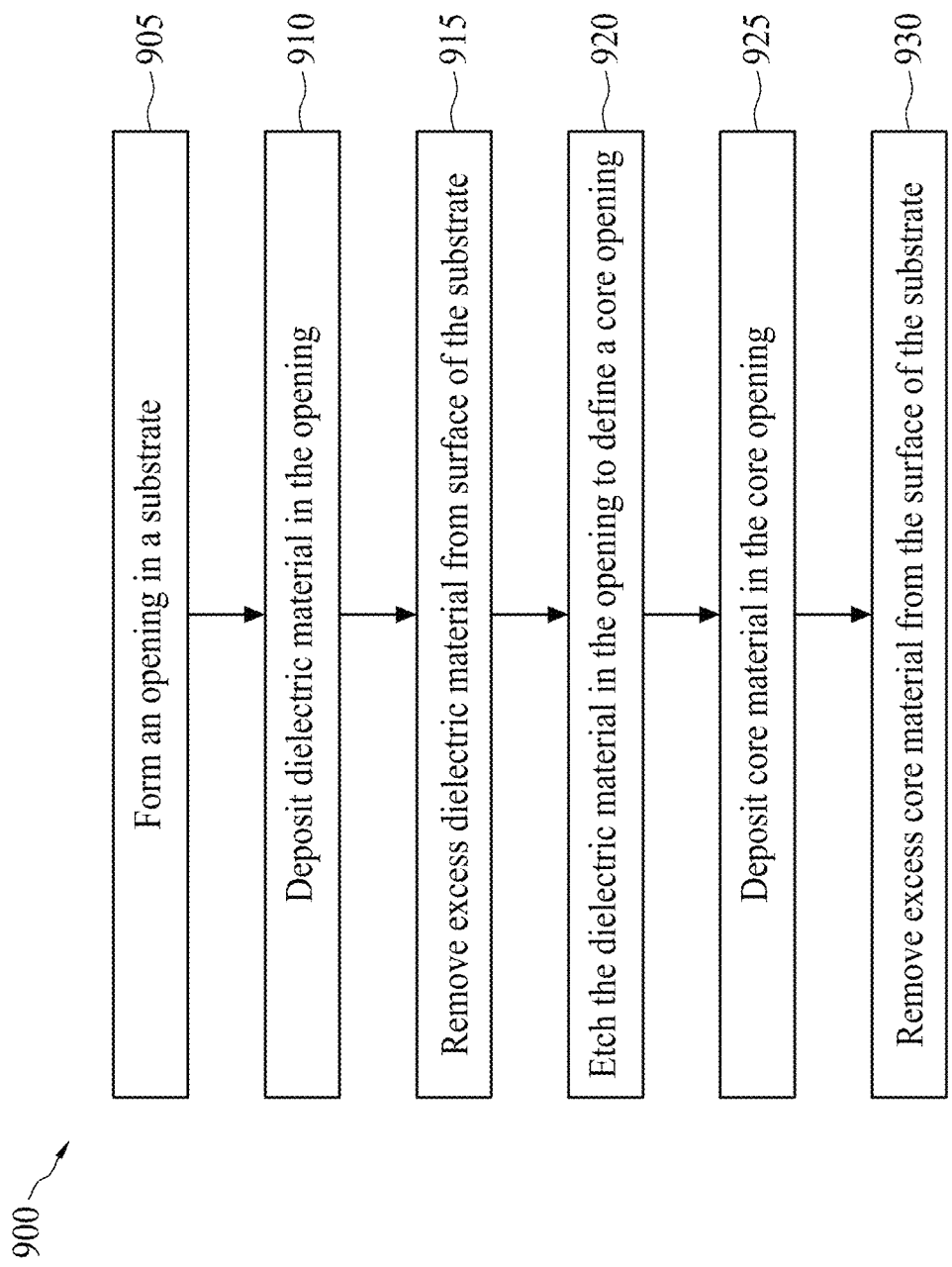
FIG. 9 is a flowchart of a method of forming an optical through via in accordance with some embodiments.

FIG. 9 is a flowchart of a method 900 of forming an OTV in accordance with some embodiments. The method 900 is usable to form the OTV 145 (FIG. 1). In operation 905, an opening is formed in a substrate. In some embodiments, the substrate is similar to the substrate 120 (FIG. 1). In some embodiments, the opening is formed using a combination of photolithography and etching processes. In some embodiments, the etching process is a dry etching process. In some embodiment, the etching process is a wet etching process.

FIG. 10A is a cross-sectional view of an OTV 1000A at an intermediate stage of manufacture in accordance with some embodiments. In some embodiments, the OTV 1000A is a result of the operation 905 (FIG. 9). The OTV 1000A includes a substrate 1010 and two openings 1020. In some embodiments, the substrate 1010 is similar to the substrate 120 (FIG. 1). In contrast with the semiconductor device 100 (FIG. 1), the OTV 1000A includes multiple openings 1020 for OTVs. One of ordinary skill in the art would understand that any number of OTVs are within the scope of this disclosure.

Returning to FIG. 9, in operation 910 a dielectric material is deposited into the opening. The dielectric material has a first refractive index. In some embodiments, the dielectric material is similar to the cladding 140b (FIG. 2). In some embodiments, the dielectric material is deposited using chemical vapor deposition (CVD), thermal oxidation, atomic layer deposition (ALD), spin-on coating or another suitable deposition process. The deposition process includes filling the opening with the dielectric material. The deposition process results in a portion of the dielectric material being deposited on a surface of the substrate outside of the opening.

FIG. 10B is a cross-sectional view of an OTV 1000B at an intermediate stage of manufacture in accordance with some embodiments. In some embodiments, the OTV 1000B is a result of the operation 910 (FIG. 9). A dielectric material 1030 fills each of the openings 1020 (FIG. 10A) and a portion of the dielectric material 1030a protrudes from the openings to cover a portion of a surface of the substrate 1010.

Returning to FIG. 9, in operation 915 excess dielectric material is removed from the surface of the substrate. The portions of the dielectric material that cover the surface of the substrate are removed. In some embodiments, the removal process includes an etching process, such as wet etching or dry etching. In some embodiments, the removal process includes chemical mechanical polishing (CMP). In some embodiments, the removal process includes grinding. Following the removal of the excess dielectric material, the surface of the substrate and the surface of the dielectric material in the opening are substantially planar.

FIG. 10C is a cross-sectional view of an OTV 1000C at an intermediate stage of manufacture in accordance with some embodiments. In some embodiments, the OTV 1000C is a result of the operation 915 (FIG. 9). The portion of the dielectric material 1030a (FIG. 10B) has been removed from the surface of the substrate 1010 and the surface of the substrate 1010 is substantially coplanar with the dielectric material 1030 in the openings.

Returning to FIG. 9, in operation 920, the dielectric material is etched to define a core opening through the dielectric material in the opening. In some embodiments, the core opening is formed using a combination of photolithography and etching processes. In some embodiments, the etching process is a dry etching process. In some embodiments, the etching process is a wet etching process. In some embodiments, the etching process is a selective etching process to minimize damage to the substrate during formation of the core opening.

FIG. 10D is a cross-sectional view of an OTV 1000D at an intermediate stage of manufacture in accordance with some embodiments. In some embodiments, the OTV 1000D is a result of the operation 920 (FIG. 9). A core opening 1040 is formed within the dielectric material 1030 in each of the openings. The core opening 1040 extends through the entirety of the opening and the dielectric material 1030 remains between an outer perimeter of the core opening 1040 and the substrate 1010.

Returning to FIG. 9, in operation 925, a core material is deposited into the core opening. The core material has a second refractive index different from the first refractive index. In some embodiments, the second refractive index is greater than the first refractive index. In some embodiments, the core material is similar to the core 140a (FIG. 2). In some embodiments, the core material is deposited using CVD, ALD, spin-on coating or another suitable deposition process. In some embodiments, a deposition process in operation 925 is a same deposition process as in operation 910. In some embodiments, the deposition process in operation 925 is different from the deposition process in operation 910. The deposition process includes filling the core opening with the core material. The deposition process results in a portion of the core material being deposited on a surface of the substrate outside of the core opening.

FIG. 10E is a cross-sectional view of an OTV 1000E at an intermediate stage of manufacture in accordance with some embodiments. In some embodiments, the OTV 1000E is a result of the operation 925 (FIG. 9). A core material 1050 fills each of the core openings 1040 (FIG. 10D) and a portion of the core material 1050a protrudes from the core openings to cover a portion of a surface of the substrate 1010.

Returning to FIG. 9, in operation 930 excess core material is removed from the surface of the substrate. The portions of the core material that cover the surface of the substrate are removed. In some embodiments, the removal process includes an etching process, such as wet etching or dry etching. In some embodiments, the removal process includes CMP. In some embodiments, the removal process includes grinding. In some embodiments, a removal process in operation 930 is a same removal process as operation 915. In some embodiments, the removal process in operation 930 is different from the removal process in operation 915. Following the removal of the excess core material, the surface of the substrate and the surface of the core material in the core opening are substantially planar.

FIG. 10F is a cross-sectional view of an OTV 1000F at an intermediate stage of manufacture in accordance with some embodiments. In some embodiments, the OTV 1000F is a result of the operation 930 (FIG. 9). The portion of the core material 1050a (FIG. 10E) has been removed from the surface of the substrate 1010 and the surface of the substrate 1010 is substantially coplanar with the core material 1050 in the openings.

In some embodiments, an order of operations of the method 900 is adjusted. For example, in some embodiments, operation 920 is performed prior to operation 915. In some embodiments, additional operations are included in the method 900. For example, in some embodiments, a layer of material for a control element (FIGS. 8A-8C) is deposited prior to operation 910. In some embodiments, an operation of the method 900 is omitted. For example, in some embodiments, operation 915 is omitted and excess dielectric material is removed during the operation 930.

FIG. 11 is a block diagram of a control system 1100 in accordance with some embodiments. The control system 1100 is usable to control voltages applied to control elements, such as the control element 520 (FIG. 5A) or the control element 620 (FIG. 6A). System 1100 includes a hardware processor 1102 and a non-transitory, computer readable storage medium 1104 encoded with, i.e., storing, the computer program code 1106, i.e., a set of executable instructions. Computer readable storage medium 1104 is also encoded with instructions 1107 for interfacing with external components. The processor 1102 is electrically coupled to the computer readable storage medium 1104 via a bus 1108. The processor 1102 is also electrically coupled to an I/O interface 1110 by bus 1108. A network interface 1112 is also electrically connected to the processor 1102 via bus 1108. Network interface 1112 is connected to a network 1114, so that processor 1102 and computer readable storage medium 1104 are capable of connecting to external elements via network 1114. The processor 1102 is configured to execute the computer program code 1106 encoded in the computer readable storage medium 1104 in order to cause system 1100 to be usable for performing a portion or all of the operations as described above with respect to controlling control elements.

In some embodiments, the processor 1102 is a central processing unit (CPU), a multi-processor, a distributed processing system, an application specific integrated circuit (ASIC), and/or a suitable processing unit.

In some embodiments, the computer readable storage medium 1104 is an electronic, magnetic, optical, electromagnetic, infrared, and/or a semiconductor system (or apparatus or device). For example, the computer readable storage medium 1104 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1104 includes a compact disk-read only memory (CD-ROM), a compact disk-read/write (CD-R/W), and/or a digital video disc (DVD).

In some embodiments, the storage medium 1104 stores the computer program code 1106 configured to cause system 1100 to perform functions described above with respect to controlling control elements. In some embodiments, the storage medium 1104 also stores information needed for performing functions described above with respect to controlling control elements as well as information generated during performing the functions described above with respect to controlling control elements, such as a voltage table parameter 1116, and/or a set of executable instructions to perform functions described above with respect to controlling control elements. In some embodiments, the voltage table parameter 1116 includes information related to when and how much voltage should be applied to each conductive via electrically connected to a control element.

In some embodiments, the storage medium 1104 stores instructions 1107 for interfacing with external components. The instructions 1107 enable processor 1102 to generate instructions readable by the external components to effectively implement functions described above with respect to controlling control elements.

System 1100 includes I/O interface 1110. I/O interface 1110 is coupled to external circuitry. In some embodiments, I/O interface 1110 includes a keyboard, keypad, mouse, trackball, trackpad, and/or cursor direction keys for communicating information and commands to processor 1102.

System 1100 also includes network interface 1112 coupled to the processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interface such as ETHERNET, USB, or IEEE-1394. In some embodiments, functions described above with respect to controlling control elements are implemented in two or more systems 1100, and information is exchanged between different systems 1100 via network 1114.

An aspect of this description relates to a semiconductor device. The semiconductor device includes a substrate. The semiconductor device further includes a waveguide on a first side of the substrate. The semiconductor device further includes a photodetector (PD) on a second side of the substrate, opposite the first side of the substrate. The semiconductor device further includes an optical through via (OTV) optically connecting the PD with the waveguide, wherein the OTV extends through the substrate from the first side of the substrate to the second side of the substrate. In some embodiments, the semiconductor device further includes a first beam deflector in the waveguide on the first side of the substrate; and a second beam deflector on the second side of the substrate, wherein the first beam deflector is in optical communication with the second beam deflector through the OTV. In some embodiments, the PD is in optical communication with the first beam deflector by the second beam deflector. In some embodiments, the first beam deflector includes a first control element, the waveguide comprises a core and a cladding, and the cladding is between the core and the first control element. In some embodiments, the first control element includes a conductive material. In some embodiments, the first control element includes a heavily doped region. In some embodiments, the first control element extends along an entirety of the cladding adjacent to a beam deflector region of the core. In some embodiments, the first control elements extends along a central portion of the cladding adjacent to a beam deflector region of the core, and peripheral portions of the cladding adjacent to the beam deflector region of the core are free of the control element. In some embodiments, the first control elements extends along peripheral portions of the cladding adjacent to a beam deflector region of the core, and a central portion of the cladding adjacent to the beam deflector region of the core is free of the control element. In some embodiments, the semiconductor device further includes multiple conductive vias electrically connected to the first control element. In some embodiments, the second beam deflector includes a second control element, and the cladding is between the core and the second control element. In some embodiments, the OTV includes a core and a cladding. In some embodiments, the semiconductor device further includes a control element between the cladding and the substrate.

An aspect of this description relates to a semiconductor device. The semiconductor device includes a substrate. The semiconductor device further includes a waveguide on a first side of the substrate, wherein the waveguide comprises a core and a cladding. The semiconductor device further includes a photonic element on a second side of the substrate, wherein the second side of the substrate is opposite the first side of the substrate. The semiconductor device further includes an optical through via (OTV) optically connecting the waveguide to the photonic element, wherein the OTV extends from the first side of the substrate to the second side of the substrate. The semiconductor device further includes a beam deflector in optical communication with the photonic element, wherein the beam deflector is configured to receive at least one voltage signal, the beam deflector is configured to deflect an optical signal along a first path in response to the at least one voltage signal having a first voltage, and the beam deflector is configured to deflect the optical signal along a second path, different from the first path, in response to the at least one voltage signal having a second voltage different from the first voltage. In some embodiments, the beam deflector includes a conductive element. In some embodiments, the beam deflector is configured to change a temperature of the cladding adjacent to a beam deflector region of the core in response to the at least one voltage signal. In some embodiments, the beam deflector includes a heavily doped region. In some embodiments, the beam deflector is configured to change a dopant concentration in the cladding adjacent to a beam deflector region of the core in response to the at least one voltage signal.

An aspect of this description relates to a method of making a semiconductor device. The method includes defining an opening extending from a first side of a substrate to a second side of the substrate, wherein the first side of the substrate is opposite the second side of the substrate. The method further includes depositing a dielectric material into the opening, wherein the dielectric material has a first refractive index. The method further includes etching the dielectric material to define a core opening extending from the first side of the substrate to the second side of the substrate. The method further includes depositing a core material into the core opening, wherein the core material has a second refractive index different from the first refractive index, and the core material is optically transparent. The method further includes removing excess core material from a surface of the substrate. In some embodiments, the method further includes optically connecting the core material with a waveguide on the first side of the substrate and a photonic element on the second side of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate, wherein the substrate comprises a semiconductor material;
a waveguide on a first side of the substrate;
a photodetector (PD) on a second side of the substrate, opposite the first side of the substrate;
an optical through via (OTV) optically connecting the PD with the waveguide, wherein the OTV extends through the substrate from the first side of the substrate to the second side of the substrate;
a first beam deflector in the waveguide on the first side of the substrate; and
a second beam deflector on the second side of the substrate, wherein the first beam deflector is in optical communication with the second beam deflector through the OTV.

2. The semiconductor device of claim 1, wherein at least one of the first beam deflector or the second beam deflector comprises a planar reflection surface.

3. The semiconductor device of claim 1, wherein the PD is in optical communication with the first beam deflector by the second beam deflector.

4. The semiconductor device of the claim 1, wherein the first beam deflector comprises a first control element, the waveguide comprises a core and a cladding, and the cladding is between the core and the first control element.

5. The semiconductor device of claim 4, wherein the first control element comprises a conductive material.

6. The semiconductor device of claim 4, wherein the first control element comprises a heavily doped region.

7. The semiconductor device of claim 4, wherein the first control element extends along an entirety of the cladding adjacent to a beam deflector region of the core.

8. The semiconductor device of claim 4, wherein the first control element extends along a central portion of the cladding adjacent to a beam deflector region of the core, and peripheral portions of the cladding adjacent to the beam deflector region of the core are free of the first control element.

9. The semiconductor device of claim 4, wherein the first control element extends along peripheral portions of the cladding adjacent to a beam deflector region of the core, and a central portion of the cladding adjacent to the beam deflector region of the core is free of the first control element.

10. The semiconductor device of claim 4, further comprising multiple conductive vias electrically connected to the first control element.

11. The semiconductor device of claim 4, wherein the second beam deflector comprises a second control element, and the cladding is between the core and the second control element.

12. The semiconductor device of claim 1, wherein the OTV comprises a core and a cladding.

13. The semiconductor device of claim 12, further comprising a control element between the cladding and the substrate.

14. A semiconductor device comprising:
- a substrate, wherein the substrate comprises a semiconductor material;
- a waveguide on a first side of the substrate, wherein the waveguide comprises a core and a cladding;
- a photonic element on a second side of the substrate, wherein the second side of the substrate is opposite the first side of the substrate;
- an optical through via (OTV) optically connecting the waveguide to the photonic element, wherein the OTV extends from the first side of the substrate to the second side of the substrate; and
- a beam deflector in optical communication with the photonic element, wherein the beam deflector is configured to receive at least one voltage signal, the beam deflector is configured to deflect an optical signal along a first path in response to the at least one voltage signal having a first voltage, and the beam deflector is configured to deflect the optical signal along a second path, different from the first path, in response to the at least one voltage signal having a second voltage different from the first voltage.

15. The semiconductor device of claim 14, wherein the beam deflector comprises a conductive element.

16. The semiconductor device of claim 15, wherein the beam deflector is configured to change a temperature of the cladding adjacent to a beam deflector region of the core in response to the at least one voltage signal.

17. The semiconductor device of claim 14, wherein the beam deflector comprises a heavily doped region.

18. The semiconductor device of claim 17, wherein the beam deflector is configured to change a dopant concentration in the cladding adjacent to a beam deflector region of the core in response to the at least one voltage signal.

19. A semiconductor device comprising:
- a substrate, wherein the substrate comprises a semiconductor material;
- a waveguide on a first side of the substrate, wherein the waveguide comprises a core and a cladding;
- a photonic element on a second side of the substrate, wherein the second side of the substrate is opposite the first side of the substrate;
- an optical through via (OTV) optically connecting the waveguide to the photonic element; and
- a beam deflector in optical communication with the photonic element, wherein the beam deflector is configured to receive at least one voltage signal, the beam deflector is configured to deflect an optical signal in a first direction in response to the at least one voltage signal having a first voltage, and the beam deflector is configured to deflect the optical signal in a second direction, different from the first direction, in response to the at least one voltage signal having a second voltage different from the first voltage.

20. The semiconductor device of claim 19, wherein the beam deflector comprises a plurality of control elements, wherein each of the plurality of control elements are spaced from another of the plurality of control elements.

* * * * *